US 6,706,165 B2

(12) United States Patent
Deng et al.

(10) Patent No.: US 6,706,165 B2
(45) Date of Patent: Mar. 16, 2004

(54) FABRICATION OF METALLIC MICROSTRUCTURES VIA EXPOSURE OF PHOTOSENSITIVE COMPOSITION

(75) Inventors: Tao Deng, Somerville, MA (US); Francisco Arias, Middletown, OH (US); Rustem F. Ismagilov, Arlington, MA (US); Paul J. A. Kenis, Champaign, IL (US); George M. Whitesides, Newton, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 234 days.

(21) Appl. No.: 09/755,645

(22) Filed: Jan. 5, 2001

(65) Prior Publication Data

US 2001/0045362 A1 Nov. 29, 2001

Related U.S. Application Data

(60) Provisional application No. 60/175,068, filed on Jan. 7, 2000.

(51) Int. Cl.[7] ................................................ C25D 5/00
(52) U.S. Cl. ......................... 205/91; 205/118; 205/205
(58) Field of Search ............................ 205/91, 118, 205

(56) References Cited

U.S. PATENT DOCUMENTS

| | | | |
|---|---|---|---|
| 3,574,933 A | | 4/1971 | Cassingham |
| 3,615,483 A | | 10/1971 | Jonker et al. |
| 3,622,322 A | | 11/1971 | Brill |
| 3,655,383 A | | 4/1972 | Shepard et al. |
| 3,671,754 A | | 6/1972 | Mundkur |
| 3,677,644 A | | 7/1972 | Harris |
| 3,772,078 A | * | 11/1973 | Polichette et al. |
| 3,779,761 A | | 12/1973 | Dustin |
| 3,880,726 A | * | 4/1975 | Sakaki |
| 3,900,614 A | | 8/1975 | Lando |
| 4,059,445 A | | 11/1977 | Sato |
| 4,104,111 A | | 8/1978 | Mack |
| 4,133,908 A | | 1/1979 | Madsen |
| 4,260,677 A | | 4/1981 | Winslow et al. |
| 4,311,381 A | | 1/1982 | Nettesheim et al. |
| 4,390,612 A | | 6/1983 | Rutledge |
| 4,511,641 A | | 4/1985 | Busman et al. |
| 4,560,643 A | | 12/1985 | Finter et al. |
| 4,603,100 A | | 7/1986 | Boston |
| 4,666,818 A | | 5/1987 | Lake et al. |
| 4,871,671 A | | 10/1989 | Errede et al. |
| 4,873,170 A | | 10/1989 | Nishinoiri et al. |
| 4,910,118 A | | 3/1990 | Adair et al. |
| 5,208,126 A | | 5/1993 | Tachikawa et al. |
| 5,352,651 A | | 10/1994 | Debe et al. |
| 5,443,713 A | | 8/1995 | Hindman |
| 5,468,603 A | | 11/1995 | Kub |
| 5,512,162 A | * | 4/1996 | Sachs et al. |

(List continued on next page.)

FOREIGN PATENT DOCUMENTS

| | | |
|---|---|---|
| DD | 153 950 A | 2/1982 |
| EP | 0 057 268 A2 | 8/1982 |
| GB | 2 150 596 A | 7/1985 |
| JP | 4 99342 A | 3/1992 |
| JP | 7 221418 A | 8/1995 |

OTHER PUBLICATIONS

International Search Report Application No. PCT/US 01/00366 dated Mar. 9, 2001.

(List continued on next page.)

Primary Examiner—Arun S. Phasge
(74) Attorney, Agent, or Firm—Wolf, Greenfield & Sacks, P.C.

(57) ABSTRACT

A method of forming microstructures. An article including a metal atom precursor is disproportionally exposed to electromagnetic radiation in an amount and intensity sufficient to convert some of the precursor to elemental metal. Additional conductive material may then be deposited onto the elemental metal to produce a microstructure.

43 Claims, 9 Drawing Sheets

U.S. PATENT DOCUMENTS

| | | |
|---|---|---|
| 5,576,074 A | 11/1996 | Weigel et al. |
| 5,576,135 A | 11/1996 | Nishikawa |
| 5,589,307 A | 12/1996 | Takeuchi |
| 5,595,637 A | 1/1997 | Tench et al. |
| 5,681,441 A | 10/1997 | Svendsen et al. |
| 5,919,402 A | 7/1999 | Murphy et al. |
| 6,020,862 A | 2/2000 | Newton et al. |

OTHER PUBLICATIONS

Keller, K. "Science and Technology of Photography," VCH: Weinheim, German, 1993.

Bjelkhagen, H.I., "Silver–Halide Recording Materials for Holography and Their Processing," Springer–Verlag: New York, 1995.

Zhang, Y. et al., "Journal of the Electrochemical Society," 146, 1270, 1999.

Lide, D.R., "CRC Handbook of Chemistry and Physics," CRC Press, New York, 1999.

Xia, Y. et al. "Soft Lithography," Agnew. Chem. Int. Ed., 1998, 37, p. 550–575.

Xu, B. et al. "Making Negative Poisson's Ratio Microstructures by Soft Lithography," Adv. Materials in Press 1999.

Kirk–Othmer Encyclopedia of Chemical Technology, $4^{th}$ Edition, 1999, p. 1541.

* cited by examiner

FABRICATION OF METALLIC MICROSTRUCTURES VIA EXPOSURE OF PHOTOSENSITIVE COMPOSITION

RELATED APPLICATIONS

This application claims priority to U.S. Provisional Patent Application Ser. No. 60/175,068, filed Jan. 7, 2000.

STATEMENT AS TO POTENTIAL RIGHTS UNDER FEDERALLY SPONSORED RESEARCH AND DEVELOPMENT

Research leading to the invention disclosed and claimed herein was supported by DARPA and the National Science Foundation (NSF) (ECS-9729405). This work used MRSEC shared facilities supported by the NSF (DMR-9400396 and DMR-9809363). The U.S. Government may have certain rights to the invention.

FIELD OF THE INVENTION

This invention relates to methods for forming a conductive pattern using photographic film.

BACKGROUND OF THE INVENTION

A multitude of techniques for shaping (such as stamping, grinding, and milling) and joining (such as welding and mechanical joining) metals are highly developed for the fabrication of macroscopic structures. Application of these techniques to the fabrication and assembly of metallic microstructures (structures having features <100 $\mu$m) becomes increasingly difficult as the feature sizes become smaller. For that reason, new approaches to microfabrication that are not derived from fabrication techniques used on a large scale have been developed. A widely used technique for fabrication of metallic microstructures is microelectrodeposition of metals on an appropriately shaped mandrel or template. Two examples of this class of processes are through-mask electroplating and LIGA (Lithographie, Galvanoformung, Abformung), both of which are based on projection photolithography (for LIGA, commonly carried out using x-rays, although the availability of the SU-8 class of photoresist has reduced the need for x-ray exposure in making thick structures). Although these methods provide ways to form metallic microstructures, they are processes with several steps, and require facilities of limited availability.

Recently, methods for the microfabrication of metallic, 2D and 3D structures based on the combination of soft lithography and microelectrodeposition have been described, the latter both through a mask of photoresist and onto patterned, conducting surfaces. The pattern-transfer step in these soft lithographic techniques typically uses an elastomeric stamp with a surface relief structure that carries the desired pattern. These stamps are usually formed by molding polydimethylsiloxane (PDMS) against a 'master' composed of a relief pattern in photoresist, and obtained by photolithography. These masters may be generated using a technique based on high-resolution commercial printing and high-resolution optical reduction. This procedure is efficient: from design, through stamp, to initial structure typically requires no more than 24 hours. Both the preparation of the mask and the generation of the master by photolithography may require access to specialized devices and facilities (i.e., high-resolution image setters, clean rooms) that are more readily available than the mask-making facilities required in high-resolution photolithography, but that are still not available to every laboratory that might benefit from medium resolution microfabrication.

SUMMARY OF THE INVENTION

The present invention provides a method for producing metallic and other conductive microstructures. The microstructures may be produced on a substrate, for example, a planar substrate such as photographic film, and may subsequently be removed from the substrate. The microstructures may be produced in a short amount of time and may use equipment readily available to those skilled in the art.

In one aspect, a method is provided in which a conductive pattern is formed. An article including a metal atom precursor capable of conversion to elemental metal is provided and a first portion of the article is disproportionately exposed to electromagnetic radiation at a level greater than at a second portion of the article. The article is exposed in an amount and for a period of time sufficient to convert at least some of the precursor at one of the portions to elemental metal at a conversion level greater than conversion of precursor to elemental metal at the other portion. Then, a metal is deposited from a source external of the metal atom precursor, proximate the portion of the article including metal atom precursor converted at a greater conversion level in an amount greater than deposition of metal at the other portion.

In another aspect, the invention provides for a method that includes deforming a flexible metal structure from a first configuration to a second configuration and depositing auxiliary metal on the metal structure to the extent that the structure is self-supporting in the second configuration.

In another aspect, the invention provides for a method that includes exposing photoresist to electromagnetic radiation through a metal mask, developing the photoresist to form a photoresist pattern, directing a metal deposition composition to the metal mask via the photoresist pattern, and depositing auxiliary metal on the metal mask.

In another aspect, the invention provides for a method of forming a conductive pattern. A photographic film is illuminated with a desired illumination configuration, and the film is developed so that illuminated or non-illuminated portions of the film are adjusted to be in an altered state. Additional conductive material is selectively deposited onto portions of the film in an altered state in amounts greater than amounts of conductive material deposited on portions of the film not in the altered state.

In another aspect, the invention provides for a method of forming a discontinuous metallic structure. A photographic film is illuminated with a desired structure configuration and the film is developed so that illuminated or non-illuminated portions of the film are adjusted to be in an altered state. Additional conductive material is selectively deposited onto portions of the film in an altered state in amounts greater than amounts of conductive material deposited on portions of the film not in the altered state.

Other advantages, novel features, and objects of the invention will become apparent from the following detailed description of the invention when considered in conjunction with the accompanying drawings, which are schematic and which are not intended to be drawn to scale. In the figures, each identical or nearly identical component that is illustrated in various figures is represented by a single numeral. For purposes of clarity, not every component is labeled in every figure, nor is every component of each embodiment of the invention shown where illustration is not necessary to allow those of ordinary skill in the art to understand the invention.

BRIEF DESCRIPTION OF THE DRAWINGS

FIG. 3b provides a graph providing results for electrical resistance at different contact points along the gold wire of FIG. 3a.

FIG. 4a illustrates a starting design as printed on paper.

FIG. 4b illustrates a three dimensional perspective view of a microfluidic system.

FIG. 4c provides a photocopy of an optical micrograph of the three electrodes of the microfluidic system of FIG. 4b.

FIG. 8b provides a photocopy of an optical micrograph of a metallic structure produced by the method illustrated in FIG. 8a.

DETAILED DESCRIPTION

Figure 1:
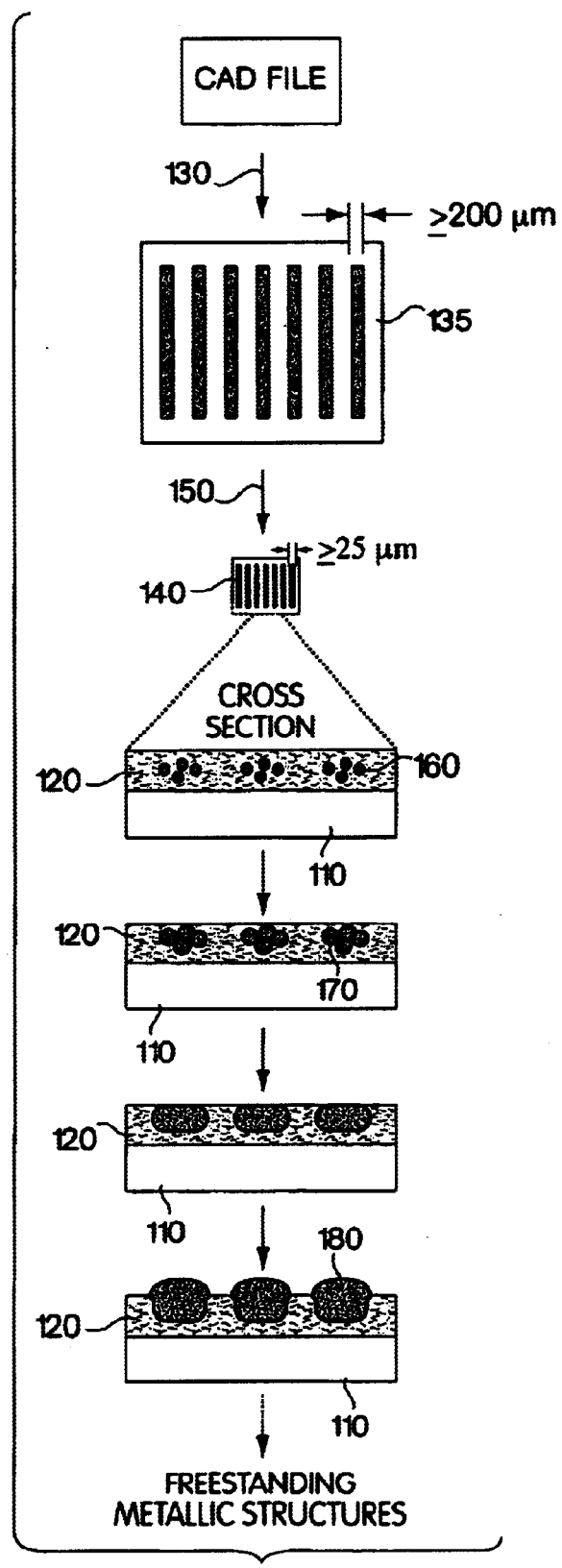
FIG. 1 provides a schematic flow chart illustrating one embodiment of the invention.

The invention provides a method for forming a pattern of conductive material on a planar or non-planar substrate. The substrate may include a chemical composition that can be altered by illumination with electromagnetic radiation. The substrate may be flexible or rigid. Preferably, the substrate includes a photosensitive composition, such as that included in a photographic or other photosensitive film. The photosensitive composition can include any type of photosensitive composition having suitable properties, such as a metal atom precursor or other material that changes state in response to exposure (or non-exposure) to electromagnetic radiation and possible subsequent development, and facilitates subsequent selective deposition of a conductive material onto or away from material areas experiencing the state change.

In one aspect of the invention, a photographic film is exposed to an illumination configuration having a desired pattern. For example, the photographic film can be standard black and white or color 35 mm photographic negative film, black and white or color slide (i.e., positive) film, large format photographic film, instant black and white or color film, black and white or color print paper, etc. The photographic film may be exposed to the illumination configuration in various ways, including using the film in a standard photographic camera to image a desired pattern, directing a beam or multiple beams of illumination, e.g., a laser beam, to illuminate desired portions of the photographic film, placing the film in sufficiently close proximity to a display device (such as a CRT display, electroluminescent (EL) display, a back-lit LCD, etc.) that displays a desired pattern and therefore illuminates the photographic film with the desired pattern, etc. Thus, desired portions of the photographic film can be disproportionately exposed to electromagnetic radiation at a level greater than other portions of the film. When exposing the photographic film using a standard photographic camera, the film can image a printed hard copy of a pattern, such as a circuit pattern printed or drawn onto a paper substrate, for example, by a computer-aided design (CAD) application and associated printer, or the film can image an actual sample of the pattern, such as an actual circuit board pattern. When exposing the film using a scanned illumination beam or other display, a CAD image file or other image data can be used to drive the illumination beam scanner, display or other device so that the film is exposed to the desired illumination configuration pattern.

Exposing the substrate, e.g., photographic film, to the desired illumination configuration causes illuminated or non-illuminated portions of the photographic composition to be adjusted into an altered state, i.e., experience a physical or chemical change. For example, if a photosensitive composition including a metal atom precursor, such as that in conventional silver halide photographic film, is used, exposure (or non-exposure) of the metal atom precursor to electromagnetic radiation (and possible subsequent development) can cause the precursor to change to an altered state, such as an elemental metal. Thus, if conventional silver halide photographic slide film is exposed to a desired illumination configuration, relatively darker or non-illuminated portions of the film will experience a chemical change such that silver particles (elemental silver), or grains, are formed in a higher density at low-level or non-illuminated portions of the film compared to film portions exposed to a higher level of illumination. In most photographic films, the physical or chemical change results after the film is exposed to illumination and developed using conventional development techniques. However, the physical or chemical change in the illuminated or non-illuminated film portions can occur simultaneously with exposure or shortly thereafter without requiring conventional photographic development. For example, when using instant photographic films, development occurs shortly after the film is exposed to illumination and does not require an additional development step. Both the exposure time and the illumination intensity are typically equal to those used in standard photographic processes and are known to those skilled in the art. When substrates other than photographic film are used, exposure times and illumination intensities can be routinely determined.

After the substrate is exposed to an illumination configuration, the illuminated or non-illuminated portions may be augmented, or further developed, by depositing a metal or other conductive material selectively on the illuminated or non-illuminated portions (portions experiencing or not experiencing a state change). For example, when using conventional silver halide photographic slide film, non-illuminated portions of the developed film can be further augmented using an electroless deposition of elemental silver such that the deposited silver is catalyzed by the silver grains in the photographic film to selectively increase the silver grain size in the film at the non-illuminated portions. Thus, further development or augmenting of the film can result in an electrically continuous pattern in portions of the film, i.e., individual silver grains in the film are selectively grown so that the grains in illuminated or non-illuminated portions contact each other or otherwise interact so as to form an electrically conductive structure on the portion. A metal is deposited in an amount sufficient to provide conductivity to a portion when the portion on which the metal is deposited becomes conductive between one end of the portion and an opposing end of the portion. Once a portion of the film becomes conductive, this portion of the film can be additionally plated, for example by using electrochemical deposition of a metal or other conductive material onto the augmented film portions. This additional deposition step can increase the width and/or thickness of the augmented portions, if desired. The result may be an electrically conductive pattern that matches, or nearly matches, the pattern of the illumination configuration used to expose the photographic film. The electrically conductive pattern can be used for testing, prototyping, actual field use, for use as a mask in photolithographic processing, etc.

As described below in one example of the invention, a pattern of silver particles embedded in the gelatin matrix of exposed and developed silver halide-based photographic film can serve as a template in a broadly applicable method for the microfabrication of metallic structures or microstructures. In this exemplary method, a CAD file or portion of a CAD file is reproduced, or approximately reproduced, in the photographic film by exposure and developing. In this example, the resulting pattern of discontinuous silver grains is developed, i.e., augmented and made electrically continuous, by electroless deposition of silver, and the electrically continuous structure is then used as the cathode for electrochemical deposition of an additional layer of the same or different metal or other conductive material. The overall process can be completed within 2 hours, starting from a CAD file, and can generate structures with the smallest dimension in the plane of the film of ~30 $\mu$m. Structures with an aspect ratio of up to five can also be obtained by using the metallic structures as photomasks in photolithography using a photo resist, such as SU-8 photoresist, on the top of the electroplated pattern, and exposed from the bottom, followed by development and electroplating through the patterned photoresist. This method of fabrication uses readily available equipment, and makes it possible to prototype a wide variety of metallic structures and devices. The resulting structures—either supported on the film backing, or freed from it and possibly mounted on another substrate—are appropriate for use as passive, structural materials such as wire frames or meshes, as electric circuits and in microfluidic, microanalytical, and microelectromechanical systems (MEMS).

The method of microfabrication described below enables rapid prototyping of metallic microstructures with planar dimensions $\geq 30$ $\mu$m. A single, continuous structure or two or more discontinuous structures may be produced on a single substrate. Production of discontinuous structures may, therefore, be performed simultaneously. An advantage of the described procedure is that laboratories with no access to sophisticated facilities for writing the masks required for photolithography can carry out microfabrication at feature sizes useful in a range of applications such as, for example: microfluidic systems, cell biology, microanalytical systems, microsensor, and microelectromechanical systems (MEMS).

One example of a pattern fabrication process involves five steps: i) printing of a design embedded in a CAD file on paper using a high-quality (e.g., 600 dots per inch, or greater, dpi printer; ii) photographic reduction of this print onto a silver halide-based photographic film using a commercial slide maker; iii) development of the exposed film; iv) electroless deposition of silver metal directly on the exposed, developed film—that is, the finished slide—to make at least portions of the pattern electrically continuous; and v) optional electrochemical deposition of metal or other electroactive or conductive material onto the silver to form or reinforce the final pattern. This method can be especially useful in the fabrication of metallic microstructures for use in prototyping devices, and in applications—3D fabrication, fabrication with unfamiliar materials—where conventional projection photolithography is difficult to apply or inapplicable.

One aspect of the invention uses a readily available photographic film recorder—a commercial slide (transparency) maker—that reproduces the pattern of a CAD file—printed on paper with an office printer—directly onto silver halide-based photographic film. Alternatively, an image may be transferred directly from a CAD file to film using software and hardware known to those skilled in the art. The pattern of silver particles in the developed photographic film, after electroless deposition to make the structure electrically conductive, serves as a template for electrochemical deposition of additional metal, and generates metallic microstructures. The entire procedure, from reproduction of the CAD file onto photographic film to completion of the final metallic structure(s) can easily be finished within 2 hours and uses readily available equipment. This procedure makes it possible for virtually all laboratories to generate a variety of useful metallic structures with small planar feature sizes, for example, 30 $\mu$m.

The single step of the simple photographic reproduction of a CAD, or other, file onto a silver halide-based film can replace the multiple (partly photolithographic) steps in microcontact printing and LIGA for the fabrication of appropriately shaped mandrels for microelectrodeposition. The complete procedure from CAD-file to metallic structure can easily be completed within two hours if instant film is used. Any photo camera or slide maker that accepts silver halide-based or other suitable photographic film may be sufficient for the reproduction of the CAD file pattern. Structures with thickness smaller than 2 $\mu$m may be porous due to the gelatin network. Higher resolution in the width of the structures can be obtained using more professional photographic equipment. It is believed that the intrinsic limit of resolution for this technique lies with the quality of the photographic equipment and is limited by aberrations of the optical elements, and not by the size of the grains in the film (<100 nm). The maximum size of a structure—or an array of structures—is limited by the size of the film used, typically 35 mm×22 mm. Larger size silver halide-based film is available (up to 300 mm×400 mm).

The following describes a specific, exemplary method of the invention and experimental results. However, as discussed above, the invention is not limited to this specific example in which a desired pattern is first printed using a computer-drawing (CAD) and the printed pattern is imaged onto a silver halide photographic film. Rather, other types of substrates, such as photographic films, imaging methods and/or conductive material augmentation processes can be used. For example, an actual micro circuit device could be used to image a frame of photographic film, i.e., one could "take a picture" of an actual microcircuit device and use the imaged photographic film to prepare a conductive circuit pattern by developing the film using conventional photographic techniques and further developing or augmenting the film using electroless plating, electro plating, or other selective deposition of conductive materials onto desired portions of the film.

EXAMPLES

Polagraph 35 mm instant black and white slide film (Polaroid Corporation; Cambridge, Mass.) was used as an article presenting metal atom precursors. Halo-Chrome™ silver electroless plating solution (Rockland Colloid Corp; Piermont, N.Y.), Tech 25 E gold plating solution (Technic Inc.; Providence, R.I.), Tech nickel plating solution (Technic Inc.; Providence, R.I.), Polydimethylsiloxane (Sylgard 184; Dow Coming, N.Y.), and SU-8 photoresist (Microchem Co.; Newton, Mass.) were used as received. $NiSO_4.6H_2O$ (99%), $NH_3.H_2O$ (29.8%), $Na_2H_2PO_2.H_2O$ (>99%), $Ru(NH_3)_6Cl_3$ (>99%), NaCl (>99%), HCl (1N), $Na_2S_2O_3$ (>99%), $K_3Fe(CN)_6$ (>99%), $K_4Fe(CN)_6$ (99%), and propylene glycol methyl ether acetate (PGMEA) were obtained from Aldrich. A black and white slide maker was bought from Polaroid (Model IPC-2). The scanning electron micrograph (SEM) was done on a LEO digital scanning electron microscope, model 982 and the cyclic voltammetry measurements were performed on a AFCB1 Bipotentiostat (Pine Instrument Company; Grove City, Pa.).

Test patterns were designed using Freehand™ software (Adobe Systems Inc.) and printed on paper using a 600 dpi printer. The printed images were reduced in size on slide films using the black and white slide maker. The contrast was set in the medium contrast mode and the exposure time was ~0.5 second. The slide film was developed using the developing package for Polagraph 35 mm slide film. The developed film was put in the silver electroless plating solution for about 15 minutes, then the desired metal was electroplated onto the patterns of silver.

Example 1

FIG. 1 illustrates an exemplary procedure used to fabricate metallic microstructures using silver halide-based photographic film. One element in this film is a substrate 110, a polyester backing (typically ~100 μm thick) covered with a gelatin layer 120 (typically ~2 μm thick) that contains silver halide. (Keller, K. *Science and Technology of Photography*; VCH: Weinheim, German, 1993.) A CAD file was first printed (130) on paper 135 with a 600 dpi office printer. A commercial slide maker was then used to reproduce (150) the black and white image on the silver halide-based photographic film 140. The initially developed film leaves the silver particles 160 isolated, with no electrically continuous path connecting adjacent portions in the pattern. Electroless deposition of additional silver, catalyzed by these silver grains, increased the grain size so that the grains come into contact 170. (Bjelkhagen, H. I. *Silver-Halide Recording Materials for Holography and Their Processing*; Springer-Verlag: New York, 1995 and Zhang, Y.; Yan, T.; Yu, S.; Zhuang, S. *Journal of the Electrochemical Society* 1999, 146, 1270.) At that point, all portions of the pattern image become electrically conducting provided, of course, that the original design was continuous). Subsequent electroplating using this image as the cathode provided metal structures that had the mechanical strength or optical density required for further applications. Freestanding metallic microstructures 180 can be obtained by dissolution of the gelatin matrix in which the metallic structures are embedded. Due to the high permeability of the gelatin layer (~2 μm thick), (Bjelkhagen, H. I. *Silver-Halide Recording Materials for Holography and Their Processing*; Springer-Verlag: New York, 1995,) the metal was deposited from both the side and the top onto the silver structures during the initial electroplating process. Once the upper surface of the metal grew out of the gelatin layer, the speed of deposition on the top of the metal structure was higher than on the side due to mass transport limitations to delivering metal ions to the sides of the structures, or within the gelatin film.

Example 2

Figure 2A:
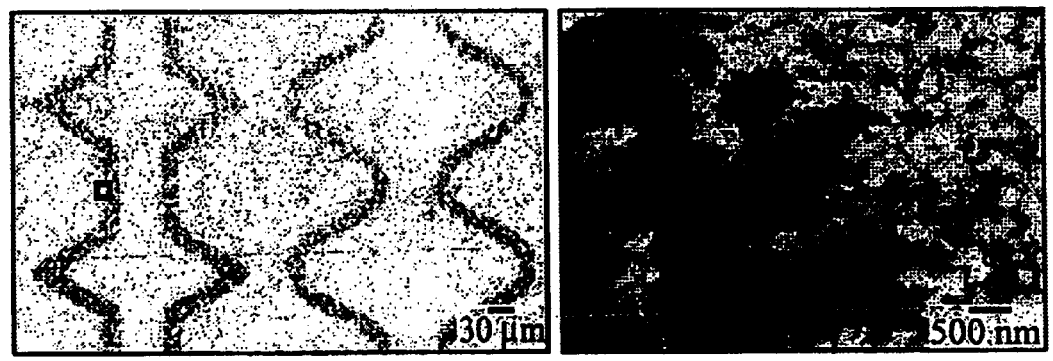
FIG. 2 provides a photocopy of three optical micrographs (a, b and c) showing three successive stages in the production of a microstructure developed using an embodiment of the invention. Each of FIGS. 2a, 2b and 2c also includes a photocopy of a micrograph of each stage at greater magnification.
Figure 2B:
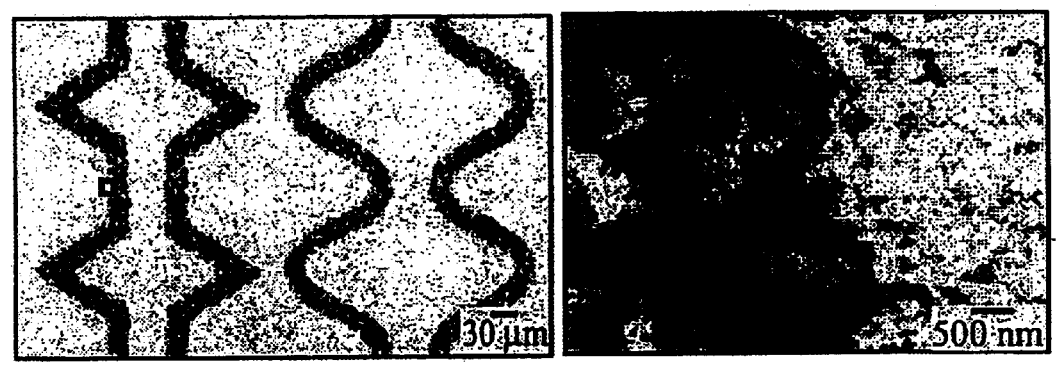
Figure 2C:
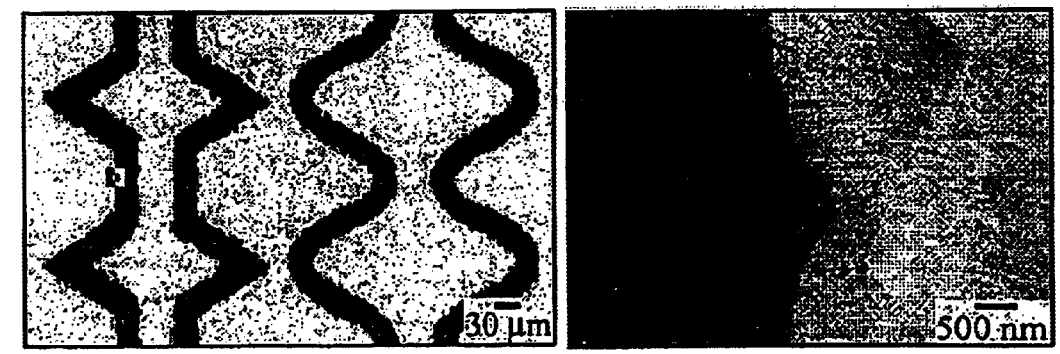

FIG. 2 shows optical micrographs of metallic lines (~30 μm wide) generated by each of the steps in the fabrication process described above in Example 1. After development of the photographic image and before electroless deposition (FIG. 2a), the primary pattern of silver halide grains had a line width of ~25 μm and an edge roughness of ~2 μm. After electroless plating (FIG. 2b), the line width increased to ~26 μm and the edge roughness remained approximately the same. After electroplating (FIG. 2c), a line width of ~30 μm and an edge roughness of ~3 μm were observed. The limited optics of the slide maker resulted in distorted, incomplete reproduction of patterns with smaller features. The edge roughness of patterns printed on the paper also contributed to the resolution of the final pattern, but it was not the major factor. The smallest feature sizes of metallic structures obtained using a master pattern printed with a 3387 dpi high-resolution image-setter were still ~30 μm, with edge roughness of ~3 μm. FIG. 2 also shows scanning electron micrographs of the microstructure of the line patterns in the different stages of the fabrication process. The growth and fusion of silver particles upon electroless plating and electroplating are clearly visible.

Example 3

Figure 3A:
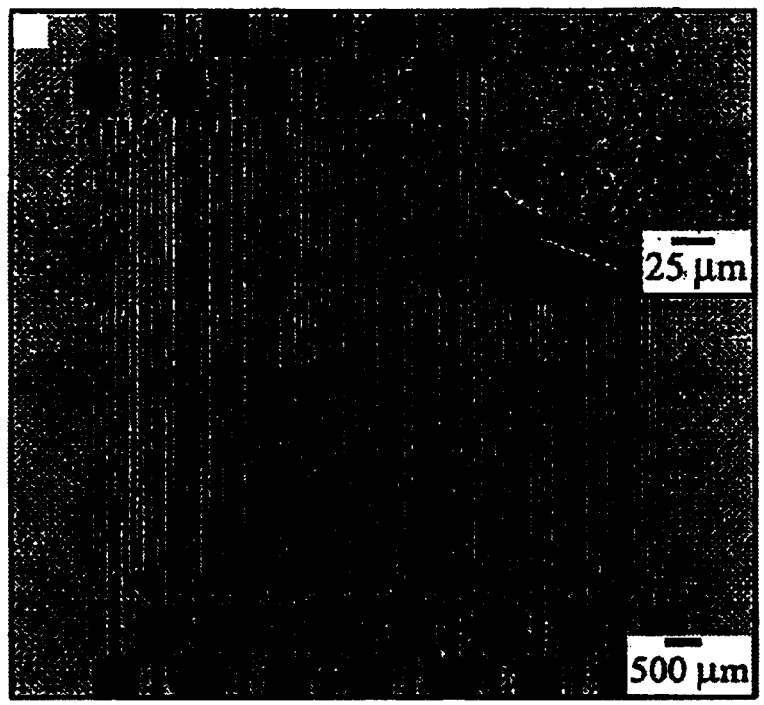
FIG. 3a provides a photocopy of an optical micrograph showing a serpentine gold wire produced using an embodiment of the invention as well as an oblique view of the edge of the same wire.
Figure 3B:
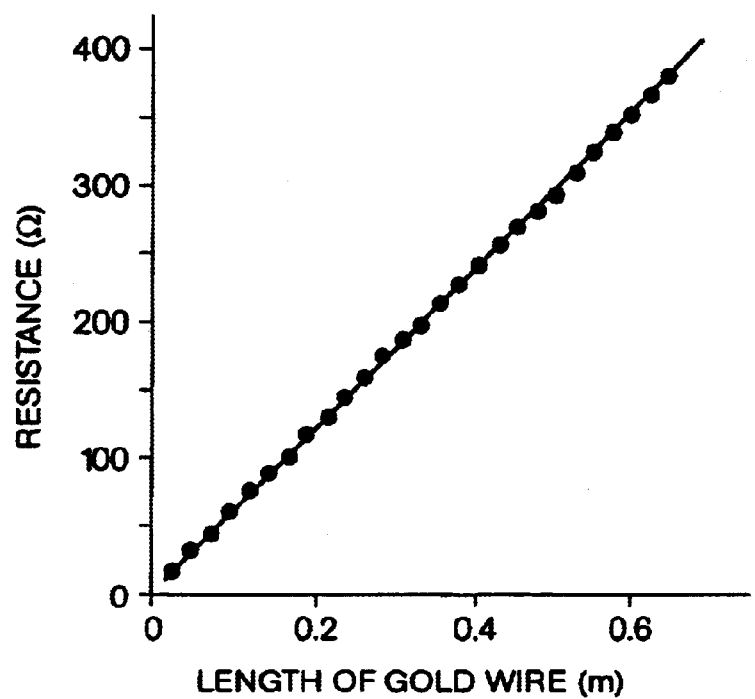

FIG. 3a shows a gold serpentine wire (~50 μm wide and ~2.5 μm thick; total length of ~648 mm) fabricated to test the electrical continuity of metallic structures made using this procedure as described in Example 1. A uniform resistivity of ~7×10$^{-8}$ Ωm (FIG. 3b) was measured over the full length of the wire, which is ~3.5 times higher than the value reported for pure bulk gold (~2×10$^{-8}$ Ωm). (Lide, D. R. *CRC Handbook of Chemistry and Physics*; CRC Press: New York, 1999.) A residual gelatin network, or a network of grain boundaries still present inside the wires after electroplating, are possible explanations for this difference.

Example 4

Figure 4A:
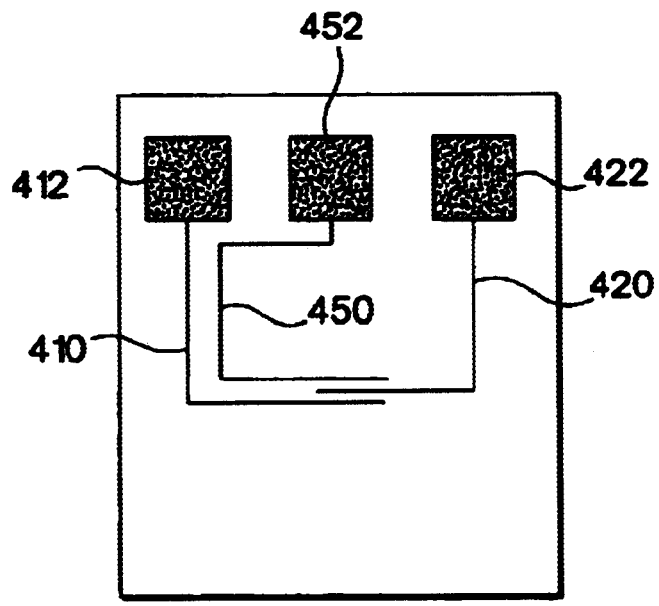
FIGS. 4a–4c illustrate three different schematic views of a microfluidic system produced by an embodiment of the invention.
Figure 4B:
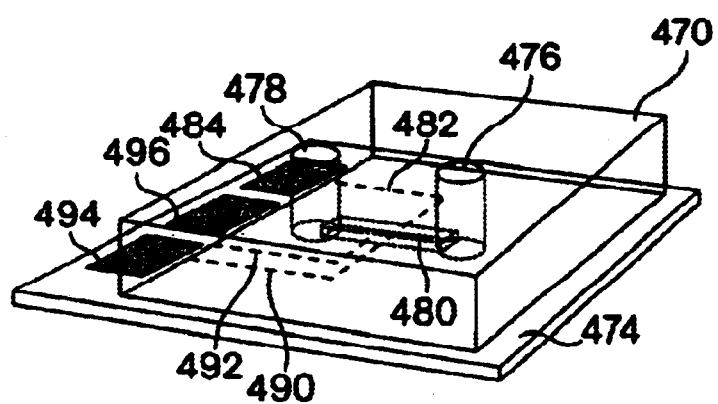
Figure 4C:
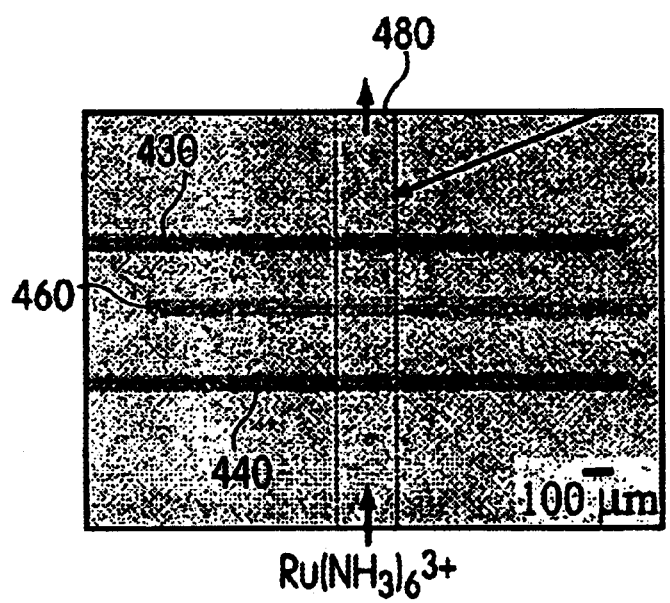
Figure 4D:
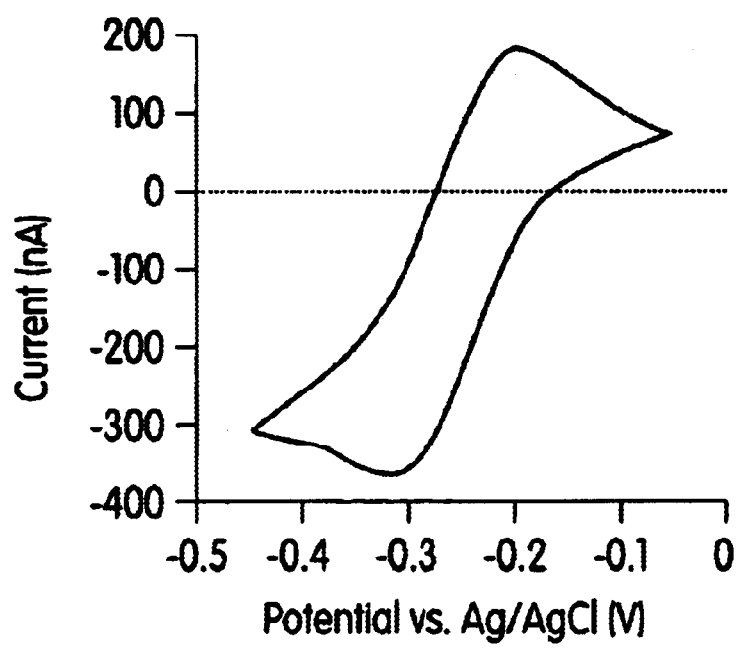
FIG. 4d provides the results of a cyclic voltammogram obtained using the microfluidic system shown in FIGS. 4b and 4c.

A three-electrode system was fabricated using the procedure described above and is illustrated in FIG. 4. FIG. 4a illustrates the design of the system on paper prior to reducing the size of the system and transferring it to film. The electrodes are represented on paper by lines 410, 420 and 450, and their contact pads by structures 412, 422 and 452 (40 mm×40 mm). The electrodes (FIGS. 4b and 4c) were differentiated into two sets by selective electroplating: two wires, 490 and 492, and their contact pads, 494 and 496, (5 mm×5 mm) were covered with gold (for the working and counter electrodes, 430 and 440, respectively) and one wire 482 and corresponding contact pad 484 (5 mm×5 mm) with silver (for the reference electrode 460). The polyester base 474 in the film enabled the use of this three-electrode structure in a microfluidic device by placing a polydimethylsiloxane (PDMS) membrane 470 having an inlet 476 and an outlet 478 with a channel 480 embossed in its surface directly on this structure (FIG. 4b and 4c). The PDMS membrane was made by casting PDMS against an SU-8 master. (Xia, Y.; Whitesides, G. M. *Agnew. Chem. Int. Ed. Engl.* 1998, 37, 550.)

Cyclic voltammetry (FIG. 4d) of a solution containing Ru(NH$_3$)$_6$Cl$_3$ demonstrated the performance of this three-electrode system. The solutions were injected into the channel using a single-use syringe connected to the inlet with a piece of polyethylene tubing. The system was treated with a 0.1 N HCl solution for about one minute prior to the electrochemical measurements. The concentration of oxygen in all solution was reduced by bubbling Ar gas through for at least 5 minutes.

Example 5

Figure 5A:
FIGS. 5a–5c provide a photocopy of three optical micrographs that schematically illustrate the stepwise assembly of a three-circle open spherical structure using an embodiment of the invention.
Figure 5B:
Figure 5C:
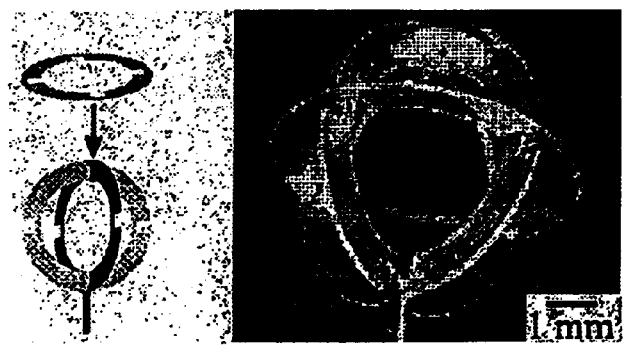

The solubility of a gelatin base in DMF or hot water allows for the fabrication of freestanding structures. (Bjelkhagen, H. I. *Silver-Halide Recording Materials for Holography and Their Processing*; Springer-Verlag: New York, 1995.) The conditions required for release are sufficiently gentle that even fragile structures are not damaged. FIG. 5 shows sequentially, in FIGS. 5a, 5b and 5c, the construction of a 3D structure, an open sphere, assembled from pieces that have been fabricated using the technique described in Example 1. The line width of each of the nickel circles was ~1 mm and their thickness was ~50 µm. This example illustrates an alternative approach to rapid fabrication of elements for 3D structures/MEMS.

Example 6

Figure 6A:
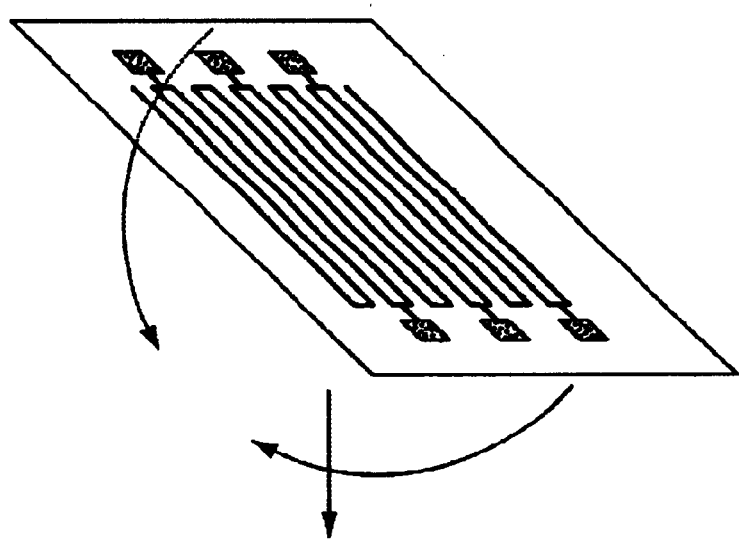
FIGS. 6a–6b provide a schematic illustration (6a) and an optical micrograph (6b) that illustrate the formation of a curved metallic structure from a planar metallic structure using an embodiment of the invention.
Figure 6B:
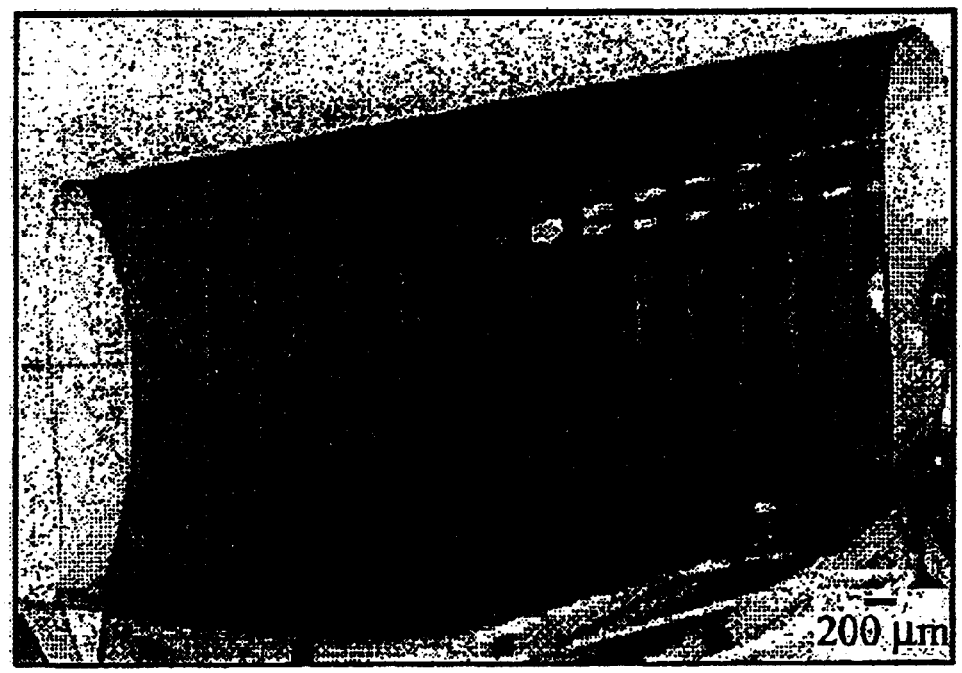

Flexible substrates, such as photographic film, make it possible to fabricate topologically complex microstructures. FIG. 6(b) shows a nickel serpentine wire (~2 µm thick, and ~100 µm wide) fabricated by electroplating on a folded silver halide film. The film was exposed in a planar orientation (FIG. 6a) and folded prior to electroless deposition and subsequent electroplating.

Example 7

Figure 7A:
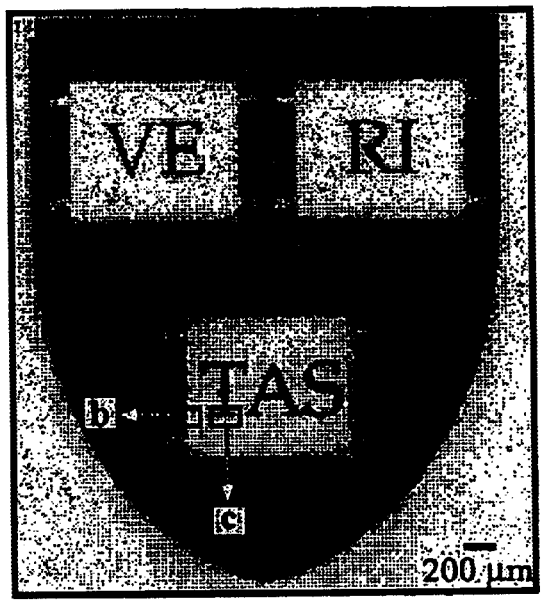
FIGS. 7a–7c provide a photocopy of three optical micrographs illustrating the formation of discontinuous metallic structures on a single substrate.
Figure 7B:
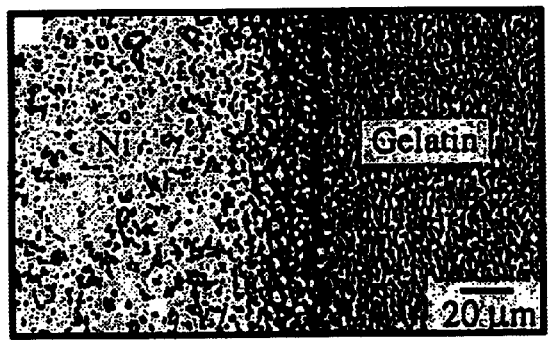
Figure 7C:
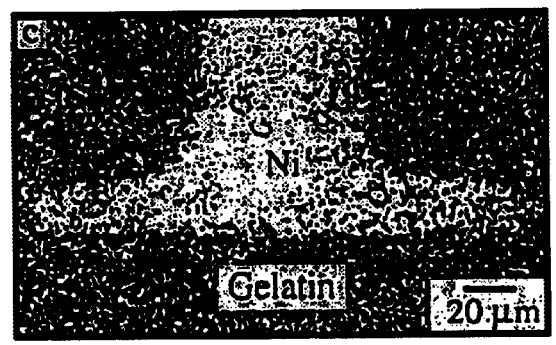

The procedure described above works well to make continuous metallic structures. During the fabrication of discontinuous structures, there is no continuous electrical pathway joining all the elements of the pattern, and therefore it is less practical to use electroplating. An electroless Ni plating solution (2.6 g NiSO$_4$.6H$_2$O, 5 ml NH$_3$.H$_2$O, and 3.6 g Na$_2$H$_2$PO$_2$.H$_2$O in 200 ml H$_2$O) was used to build a thick Ni layer on the patterned silver particles (continuous or discontinuous). FIG. 7a shows a "Veritas" logo consisting of a ~2 µµm nickel layer deposited using electroless plating alone. FIGS. 7b and 7c illustrate magnified portions of FIG. 7a to show detail of the continuous individual structures obtained on a single substrate without the use of electroplating.

Example 8

Figure 8A:
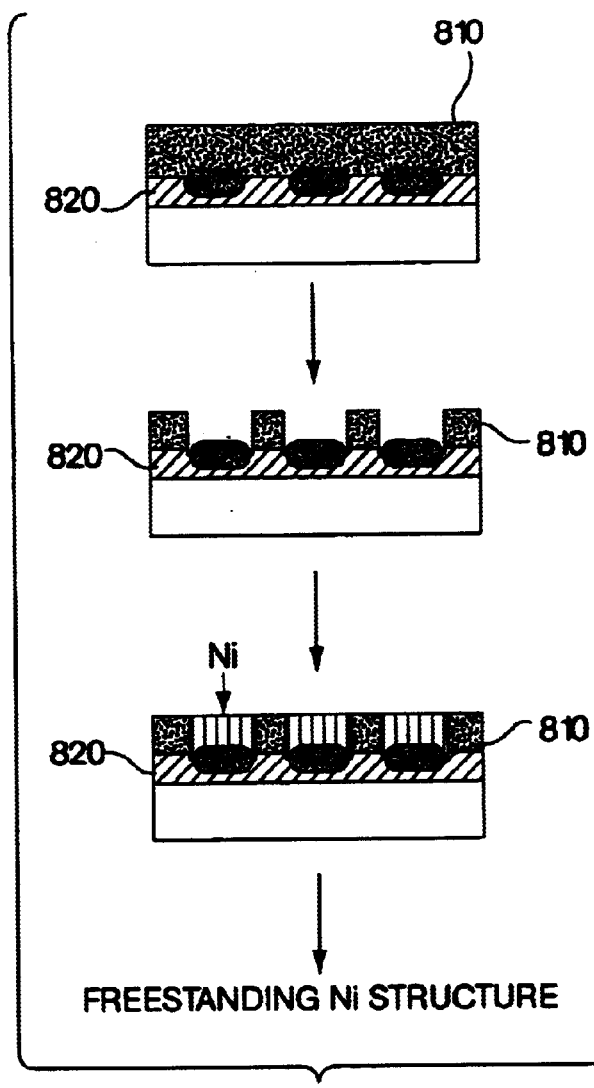
FIG. 8a provides a schematic illustration of an embodiment of the invention used to produce a free standing metallic structure.

The structures fabricated above all have relatively low aspect ratios (height:width), typically less than 0.1. FIG. 8 shows a procedure for the fabrication of structures with a high aspect ratio. First, the film carrying the low aspect ratio structure was used both as the substrate and the mask in a photolithographic step. The photoresist 810 was exposed to UV light from below the structure/mask 820 layer. Subsequent use of the photoresist pattern as the mask to direct electrodeposition of metals while using the original, low aspect ratio structure as the cathode resulted in high aspect ratio structures. The high aspect structures were produced as follows:

Electroplated film was produced as outlined above. The electroplated film was put in an etching solution containing 0.1 M Na$_2$S$_2$O$_3$/0.01 M K$_3$Fe(CN)$_6$/0.001 M K$_4$Fe(CN)$_6$ for ~1 min to remove the gold particles reduced by the gelatin in the non-patterned area. This etching step is preferred to make the film more transparent to UV during the patterning of photoresist. The film was immobilized on a glass slide using cellophane tape. SU-8 photoresist was spincoated directly onto the film at 500 rpm for 20 S. The film was baked at 95° C. for ~10 hours, followed by exposure from the bottom for 7.5 min (10 mJ.cm$^{-2}$.S$^{-1}$ at 405 nm) with a Karl Zeiss MJB3 contact aligner and post-baking at 90° C. for ~10 min. The photoresist was developed in PGMEA for ~4 hours with magnetic stirring. Finally, through mask electroplating of the film carrying the patterned photoresist in a nickel electroplating bath was performed for ~150 hours while maintaining a current of 10 mA.

Figure 8B:
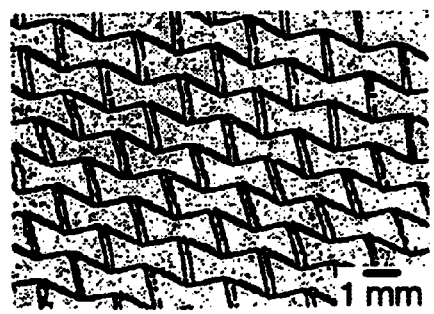

The fact that the film served as the substrate and the fact that the metallic structures on the film not only served as the mask in the photolithographic step, but also as the cathode in the electroplating procedure reduce the number of steps significantly compared to conventional processes for the fabrication of high aspect ratio metallic structures. We obtained a negative Poisson ratio structure (Xu, B.; Arias, F.; Brittain, S. T.; Zhao, X.-M.; Grzybowski, B.; Torquato, S.; Whitesides, G. M. *Adv Mater.* in press 1999) with a maximum aspect ratio of 5 (FIG. 8b).

Those skilled in the art would readily appreciate that all parameters and configurations described herein are meant to be exemplary and that actual parameters and configurations will depend upon the specific application for which the systems and methods of the present invention are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described. The present invention is directed to each individual feature, system, or method described herein. In addition, any combination of two or more such features, systems or methods, provided that such features, systems, or methods are not mutually inconsistent, is included within the scope of the present invention.

What is claimed:

1. A method of forming a conductive pattern, comprising:
   providing an article including a metal atom precursor capable of conversion to elemental metal;
   disproportionately exposing a first portion of the article to electromagnetic radiation at a level greater than exposure at a second portion of the article, in an amount and for a period of time sufficient to convert at least some of the precursor at one of the portions to elemental metal at a conversion level greater than conversion of precursor to elemental metal at the other portion; and
   depositing metal, from a source external of the metal atom precursor, proximate the portion of the article including metal atom precursor converted at a greater conversion level in an amount greater than deposition of metal at the other portion to form the conductive pattern, wherein a planar dimension of a portion of the conductive pattern is less than about 100 µm in width.

2. A method as in claim 1, wherein the metal atom precursor is a metal salt.

3. The method of claim 2 wherein the metal salt is a silver halide.

4. The method of claim 1 wherein the metal deposited from the source external of the metal atom precursor is deposited using electroless deposition.

5. The method of claim 1 wherein the article comprises photographic film.

6. The method of claim 1 wherein the planar dimension of a portion of the conductive pattern is less than about 50 $\mu$m in width.

7. The method of 1 the planar dimension of a portion of the conductive pattern is about 30 $\mu$m in width.

8. The method of claim 1 further comprising freeing the metal from the article.

9. The method as in claim 1, wherein the metal is deposited proximate the first portion while essentially no metal is deposited proximate the second portion.

10. The method as in claim 9 wherein the metal is deposited in an amount sufficient to provide conductivity to the first portion.

11. The method as in claim 9 further comprising electroplating a metal onto the first portion.

12. The method as in claim 1, wherein the metal is deposited proximate the second portion while essentially no metal is deposited proximate the first portion.

13. The method as in claim 12 wherein the metal is deposited in an amount sufficient to provide conductivity to the second portion.

14. The method as in claim 12 further comprising electroplating a metal onto the second portion.

15. A method of forming a conductive pattern, comprising:

providing an article including a metal atom precursor capable of conversion to elemental metal;

photographically reducing an image onto the article to convert at least some of the precursor at a first portion of the article to elemental metal at a conversion level greater than conversion of precursor to elemental metal at a second portion; and depositing metal, from a source external of the metal atom precursor, proximate the portion of the article including metal atom precursor converted at a greater conversion level in an amount greater than deposition of metal at the other portion to form the pattern.

16. A method as in claim 15, wherein the metal atom precursor is a metal salt.

17. The method of claim 16 wherein the metal salt is a silver halide.

18. The method of claim 15 wherein the metal deposited from the source external of the metal atom precursor is deposited using electroless deposition.

19. The method of claim 15 wherein the article comprises photographic film.

20. The method of claim 15 wherein the planar dimension of a portion of the conductive pattern is less than about 100 $\mu$m in width.

21. The method of claim 15 wherein the planar dimension of a portion of the conductive pattern is less than about 50 $\mu$m in width.

22. The method of claim 15 wherein the planar dimension of a portion of the conductive pattern is about 30 $\mu$m in width.

23. The method of claim 15 further comprising freeing the metal from the article.

24. The method as in claim 15, wherein the metal is deposited proximate the first portion while essentially no metal is deposited proximate the second portion.

25. The method as in claim 24 wherein the metal is deposited in an amount sufficient to provide conductivity to the first portion.

26. The method as in claim 24 further comprising electroplating a metal onto the first portion.

27. The method as in claim 15, wherein the metal is deposited proximate the second portion while essentially no metal is deposited proximate the first portion.

28. The method as in claim 27 wherein the metal is deposited in an amount sufficient to provide conductivity to the second portion.

29. The method as in claim 27 further comprising electroplating a metal onto the second portion.

30. A method of forming a metallic structure, comprising:

providing an article including a metal atom precursor capable of conversion to elemental metal;

disproportionately exposing a first portion of the article to electromagnetic radiation at a level greater than exposure at a second portion of the article, in an amount and for a period of time sufficient to convert at least some of the precursor at one of the portions to elemental metal at a conversion level greater than conversion of precursor to elemental metal at the other portion, depositing metal, from a source external of the metal atom precursor, proximate the portion of the article including metal atom precursor converted at a greater conversion level in an amount greater than deposition of metal at the other portion to form a metallic structure; and freeing the metallic structure from the article.

31. The method of claim 30 wherein depositing metal comprises depositing metal in a pattern, wherein a planar dimension of a portion of the pattern is less than about 100 microns in width.

32. The method of claim 31 wherein the planar dimension of the portion of the pattern is less than about 50 microns in width.

33. The method of claim 31 wherein the planar dimension of the portion of the pattern is about 30 microns in width.

34. A method as in claim 30 wherein the metal atom precursor is a metal salt.

35. The method of claim 34 wherein the metal salt is a silver halide.

36. The method of claim 30 wherein the metal deposited from the source external of the metal atom precursor is deposited using electroless deposition.

37. The method of claim 30 wherein the article comprises photographic film.

38. The method of claim 30, wherein the metal is deposited proximate the first portion while essentially no metal is deposited proximate the second portion.

39. The method of claim 38 wherein the metal is deposited in an amount sufficient to provide conductivity to the first portion.

40. The method of claim 39 further comprising electroplating a metal onto the first portion.

41. The method of claim 30, wherein the metal is deposited proximate the second portion while essentially no metal is deposited proximate the first portion.

42. The method of claim 41 wherein the metal is deposited in an amount sufficient to provide conductivity to the second portion.

43. The method of claim 42 further comprising electroplating a metal onto the second portion.

* * * * *